United States Patent
Agarwal et al.

(10) Patent No.: US 9,742,369 B2
(45) Date of Patent: Aug. 22, 2017

(54) PROGRAMMABLE RESISTOR ARRAY FOR A CONTINUOUS TIME PGA FILTER

(71) Applicant: TEXAS INSTRUMENTS INCORPORATED, Dallas, TX (US)

(72) Inventors: Nitin Agarwal, Bangalore (IN); Aniruddha Roy, Bangalore (IN)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 15/144,531

(22) Filed: May 2, 2016

(65) Prior Publication Data
US 2017/0149398 A1    May 25, 2017

Related U.S. Application Data

(60) Provisional application No. 62/257,862, filed on Nov. 20, 2015.

(51) Int. Cl.
| H03H 19/00 | (2006.01) |
| H03G 1/00 | (2006.01) |
| H03K 5/08 | (2006.01) |
| H02M 3/07 | (2006.01) |

(52) U.S. Cl.
CPC ............ *H03G 1/0094* (2013.01); *H02M 3/07* (2013.01); *H03H 19/004* (2013.01); *H03K 5/08* (2013.01)

(58) Field of Classification Search
CPC .............................. H03H 19/004; H03K 5/08
See application file for complete search history.

(56) References Cited

U.S. PATENT DOCUMENTS

| 7,782,117 B2* | 8/2010 | Stultz | H03K 17/063 327/389 |
| 8,004,340 B2* | 8/2011 | Guo | H03K 17/164 326/62 |
| 9,413,231 B2* | 8/2016 | Huang | H02M 3/07 |

OTHER PUBLICATIONS

Kim et al., "Body Effect Compensated Switch for Low Voltage Switched-Capacitor Circuits," IEEE International Symposium on Circuits and Systemms, vol. 4, IV-437, IV-440 (2002).

* cited by examiner

*Primary Examiner* — Jeffrey Zweizig
(74) *Attorney, Agent, or Firm* — John R. Pessetto; Charles A. Brill; Frank D. Cimino

(57) ABSTRACT

A compensation circuit includes an amplifier coupled between a first voltage terminal and a common terminal. The amplifier has a first output terminal. A current source transistor has a current path coupled between a second voltage terminal and a second output terminal. A threshold voltage sense transistor has a current path coupled between the first and second output terminals. A gate and drain of the threshold voltage sense transistor are connected. An output transistor having a current path coupled between the first output terminal and a third output terminal has a gate coupled to the second output terminal.

17 Claims, 9 Drawing Sheets

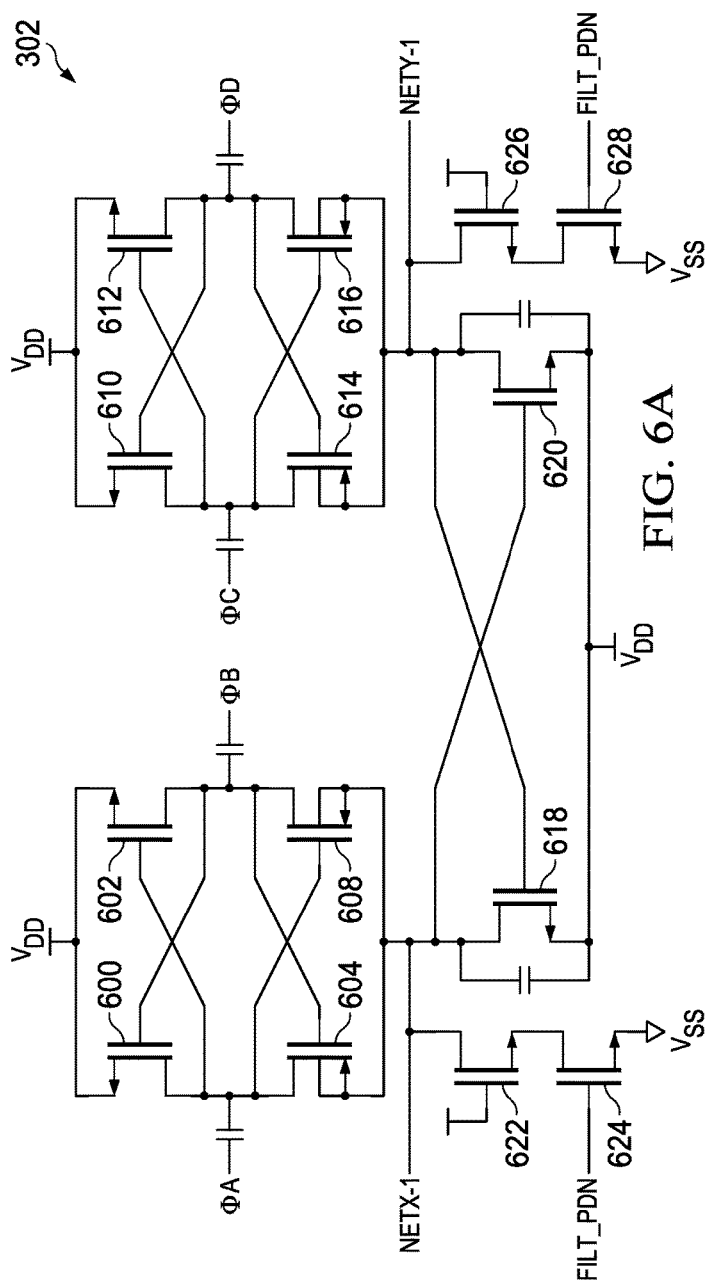
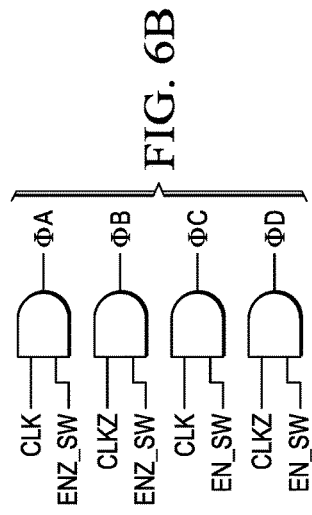
FIG. 6A
FIG. 6B

PROGRAMMABLE RESISTOR ARRAY FOR A CONTINUOUS TIME PGA FILTER

CROSS-REFERENCES TO RELATED APPLICATIONS

This application claims the benefit under 35 U.S.C. 119(e) of U.S. Provisional Application No. 62/257,862, filed Nov. 20, 2015, which is incorporated by reference herein in its entirety.

BACKGROUND OF THE INVENTION

Embodiments of the present invention relate to a programmable resistor array for a continuous time, programmable gain amplifier (PGA) filter.

Reduced power supply voltages and gate dielectric thickness limit overdrive voltage available for metal oxide semiconductor (MOS) switches in rail-to-rail circuit operation. A maximum gate voltage limit is imposed by gate oxide integrity (GOI) reliability, and a minimum gate voltage limit is imposed by a requirement for linear operation of the MOS switch. CMOS transmission gate switches are generally unsuitable for switching operations due to the nonlinear region near the center of the power supply voltage range between p-channel and n-channel threshold voltages. Referring to FIGS. 1A and 1B, Kim et al., "Body Effect Compensated Switch for Low Voltage Switched-Capacitor Circuits," IEEE International Symposium on Circuits and Systems, Vol. 4, IV-437, IV-440 (2002), disclose a compensated switch for low voltage switched-capacitor circuits. The improved circuit is shown at FIG. 1A with compensated switch SW circled. The concept of operation is illustrated at FIG. 1B and described at pages IV-438 through IV-439. In operation, the circuit first discharges the gate of SW by switch S5 and charges capacitor $C_B$ to $V_{DD}$ by switches S1 and S3. Then switches S1, S3, and S5 are turned off, and switches S2 and S4 are turned on to supply a compensated gate voltage to switch SW. Although this circuit performs well for switched-capacitor applications such as a duty-cycled environment where the switch does not need to remain on continuously, it is incompatible with continuous time operation.

BRIEF SUMMARY OF THE INVENTION

In a preferred embodiment of the present invention, a circuit is disclosed. The circuit includes an amplifier coupled between a first voltage terminal and a common terminal. The amplifier has a first output terminal. A current source transistor has a current path coupled between a second voltage terminal and a second output terminal. A threshold voltage sense transistor has a current path coupled between the first and second output terminals. A gate and drain of the threshold voltage sense transistor are connected. An output transistor has a current path coupled between the first output terminal and a third output terminal and has a control gate coupled to the second output terminal.

BRIEF DESCRIPTION OF THE SEVERAL VIEWS OF THE DRAWING

FIG. 6A is a circuit diagram of boost circuit BOOST-1 302 of FIG. 3;

FIG. 6B is a schematic diagram showing clock generation of clocks used in FIG. 6A;

DETAILED DESCRIPTION OF THE INVENTION

The preferred embodiments of the present invention provide significant advantages over the prior art for a programmable resistor array for a continuous time, programmable gain amplifier (PGA) filter.

Figure 1A:
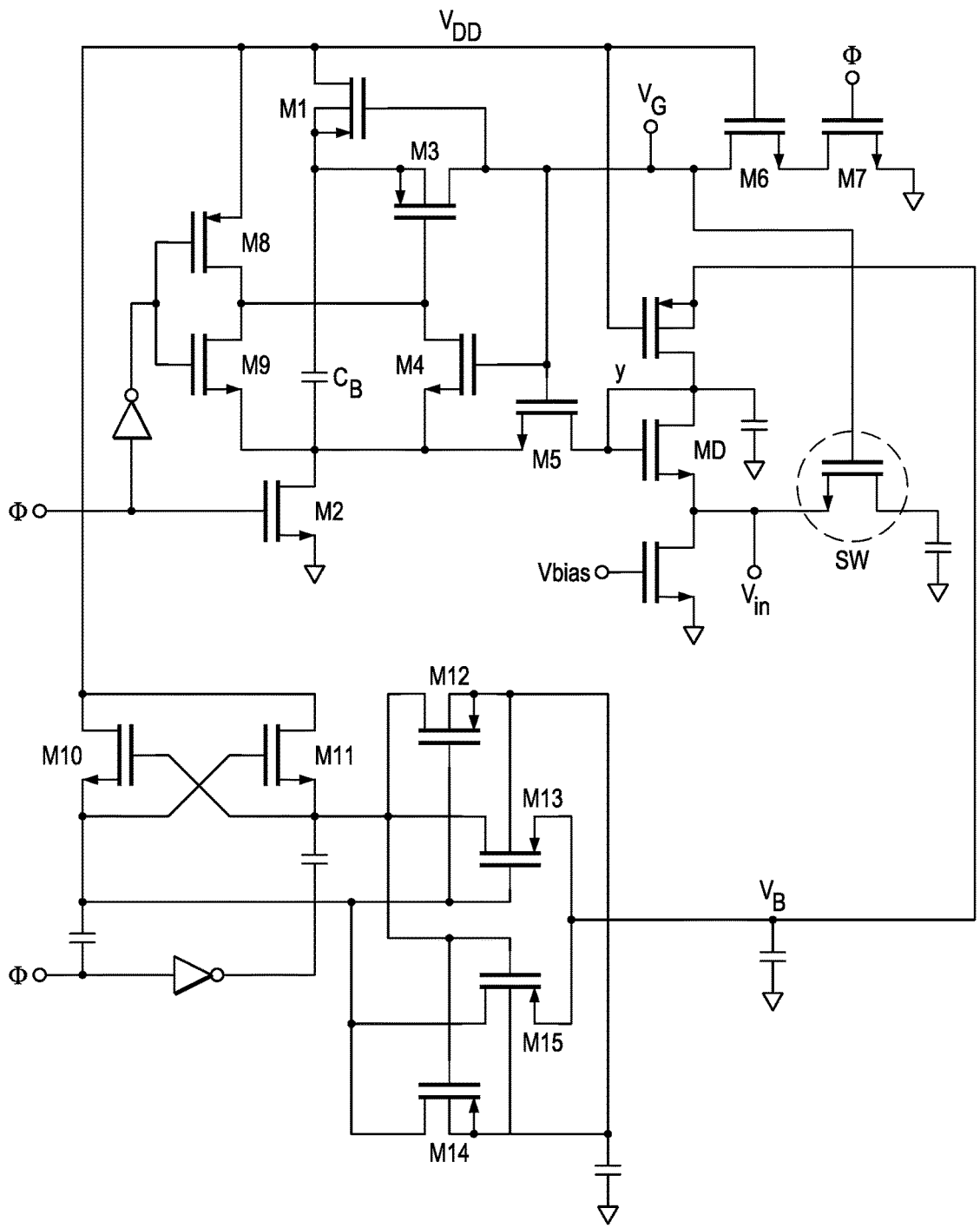
FIGS. 1A and 1B are body effect compensated switched-capacitor circuits of the prior art.
Figure 1B:
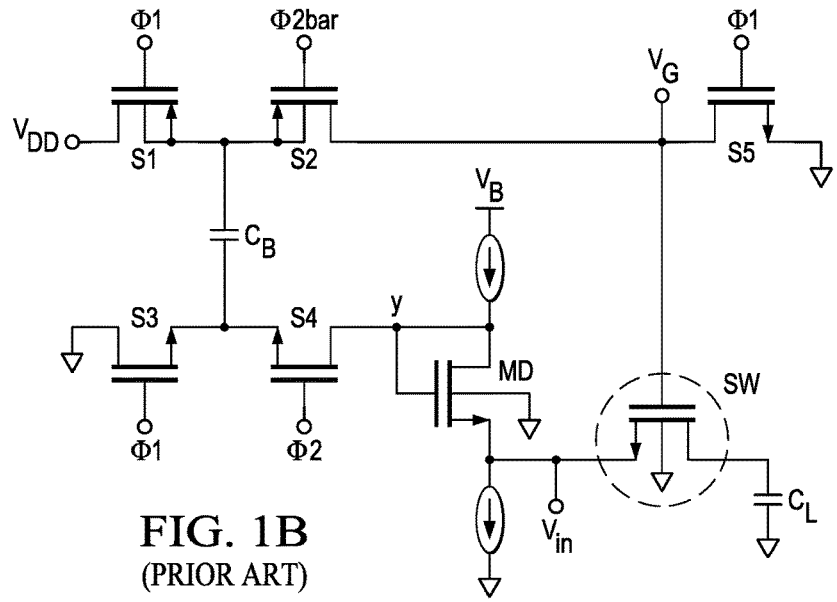
Figure 2:
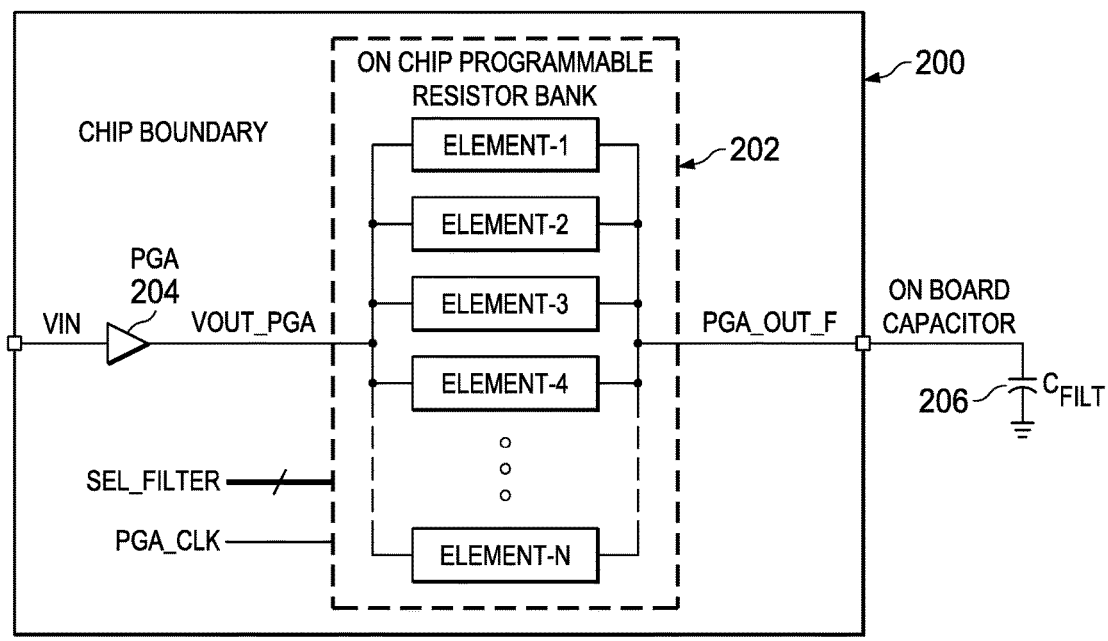
FIG. 2 is a simplified diagram of a programmable resistor array circuit with a programmable gain amplifier filter according to the present invention.
Figure 2:
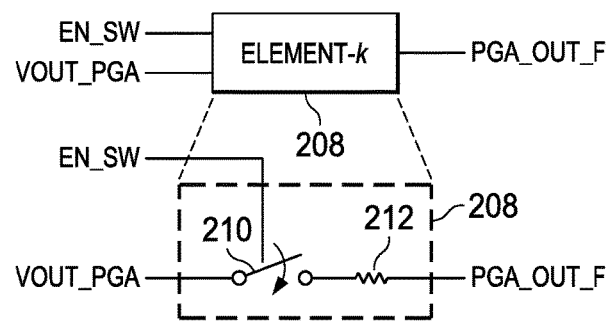

Referring to FIG. 2, there is a simplified diagram of an integrated circuit 200 having programmable resistor array 202 with a programmable gain amplifier (PGA) filter according to the present invention. The PGA filter advantageously provides a user selectable bandwidth of $\frac{1}{2\pi R_{FILT} C_{FILT}}$ to filter both PGA and system-generated noise. The PGA 204 is coupled to receive an input signal VIN and produce an amplified output signal VOUT_PGA. The output signal VOUT_PGA is applied to resistor array circuit 202, having N selectable circuit elements. One or more of the circuit elements may be selected by the SEL_FILTER bus to program a desired filter bandwidth. Resistors of the resistor array circuit 202 may have a same value or may have different values, such as binary weighted values. The present invention is not limited to any particular resistor values. The resistor array circuit 202 is also coupled to receive clock signal PGA_CLK, which is used to generate various clocks to operate a voltage doubler circuit as will be explained in detail. Selected resistor elements produce an output signal PGA_OUT_F that is applied to capacitor $C_{FILT}$ 206. Capacitor $C_{FILT}$ 206 is preferably formed on the same circuit board as the integrated circuit and is selected to provide a desired filter bandwidth together with the selected resistor elements.

Each resistor element of resistor array circuit 202, for example element-k 208, is coupled to receive a respective enable switch signal EN_SW from the SEL_FILTER bus. An active enable switch signal EN_SW closes switch 210 to conduct input signal VOUT_PGA to output signal PGA_OUT_F via resistor 212. Alternatively, an inactive enable switch signal EN_SW opens switch 210 so that resistor 212 remains unselected.

Figure 3:
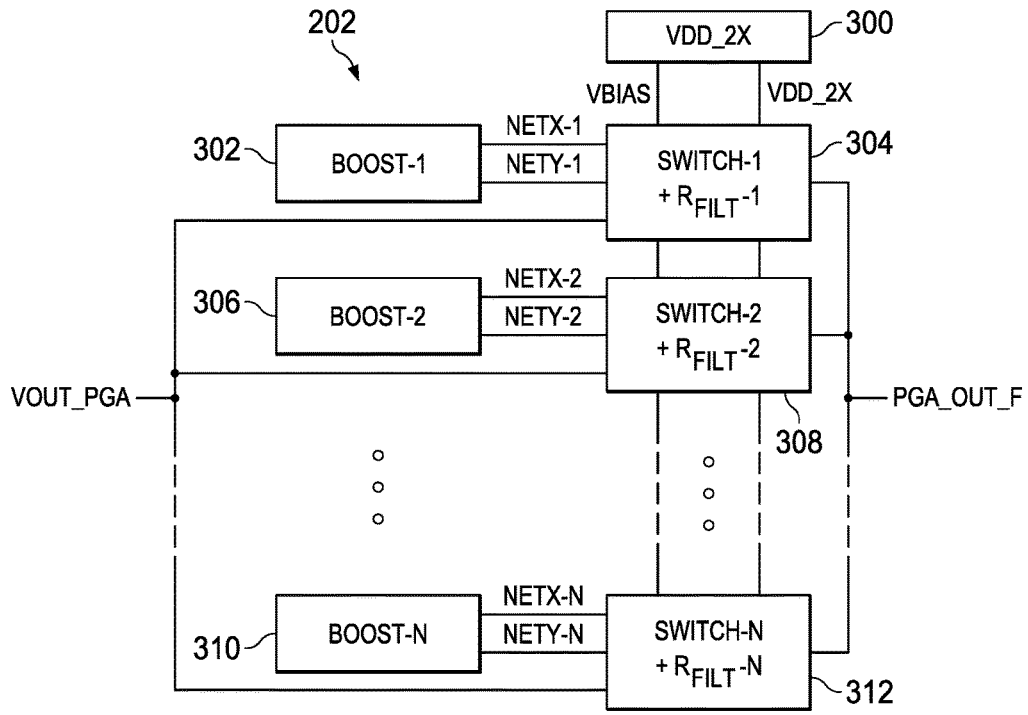
FIG. 3 is a block diagram of one embodiment of the programmable resistor array circuit of FIG. 2.

Turning now to FIG. 3, there is a block diagram of one embodiment of the programmable resistor array circuit 202 of FIG. 2. The circuit includes N switch elements, where N is a positive integer. Each switch element includes a boost circuit and a respective switch. For example, the first switch element includes boost circuit 302 coupled to switch 304. The second switch element includes boost circuit 306 coupled to switch 308, Switch element N includes boost circuit N coupled to switch N. Each boost circuit is coupled to receive PGA output signal VOUT_PGA. Each switch is coupled to a common output terminal that produces output signal PGA_OUT_F. Voltage doubler circuit 300 produces bias signal VBIAS and VDD_2X, which are applied to each switch.

Figure 4A:
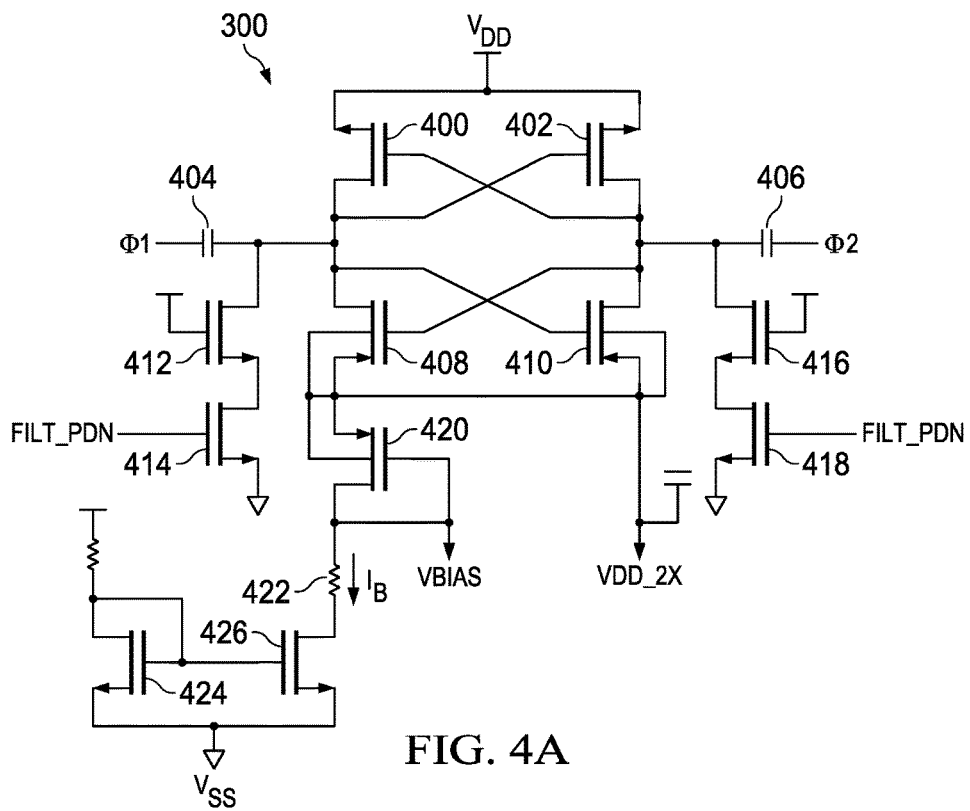
FIG. 4A is a circuit diagram of the voltage doubler circuit 300 of FIG. 3.
Figure 4B:
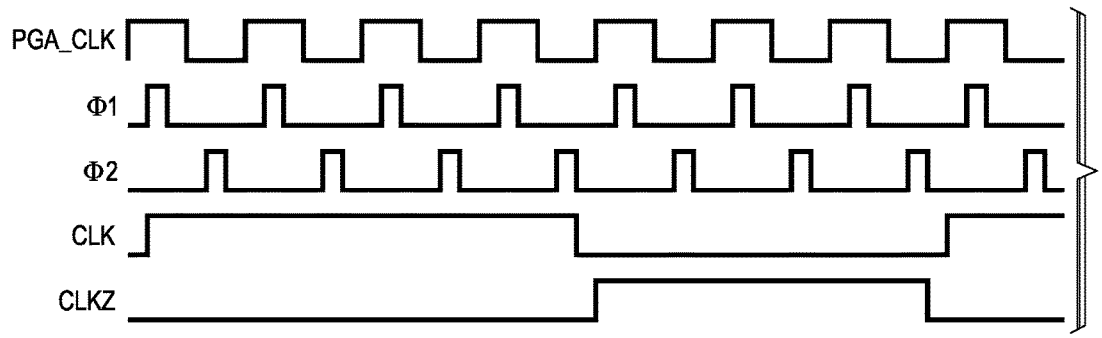
FIG. 4B is a timing diagram showing non overlapping clocks of the circuits of FIGS. 4A, 6B, 9, and 10.

Referring next to FIG. 4A, there is a circuit diagram of the voltage doubler circuit 300 of FIG. 3. Here, and in the following discussion, the same reference numerals are used to designate substantially the same circuit elements. FIG. 4B is a timing diagram of clock signals generated from PGA_CLK (FIG. 2) that are used to operate voltage doubler circuit 300 as well as other circuits. The voltage doubler circuit includes cross coupled n-channel transistors 400 and 402 having their sources connected to supply voltage terminal $V_{DD}$ as indicated by the short horizontal line. Cross coupled p-channel transistors 408 and 410 have their sources connected to supply voltage terminal VDD_2X, which is approximately twice supply voltage $V_{DD}$ and is indicated by two short horizontal lines. The common drain terminal of transistors 400 and 408 is connected to pump capacitor 404. The common drain terminal of transistors 402 and 410 is connected to pump capacitor 406. N-channel transistors 412 and 414 form a first filter power down circuit connected to the common drain terminal of transistors 400 and 408 Likewise, n-channel transistors 416 and 418 form a second filter power down circuit connected to the common drain terminal of transistors 402 and 410.

In normal operation, control signal FLT_PDN is low, and n-channel transistors 414 and 418 are off. Alternatively, when control signal FLT_PDN is high, n-channel transistors 414 and 418 are on, and the PGA filter circuit is disabled. N-channel transistors 412 and 416 act as voltage dividers, so that the maximum voltage at the drain terminals of transistors 414 and 418 is $V_{DD}$ less an n-channel threshold voltage ($V_{DD}$-Vtn). Antiphase clock signals φ1 and φ2 (FIG. 4B) alternately pump charge through respective capacitors 404 and 406 to produce VDD_2X. For example, a low level of φ2 turns n-channel transistor 400 off and p-channel transistor 408 on. When φ1 goes high it pumps charge on capacitor 404 through p-channel transistor 408 to supply voltage VDD_2X. The high level of φ1 also turns on n-channel transistor 402 to precharge capacitor 406 to $V_{DD}$. Next, a low level of φ1 turns n-channel transistor 402 off and p-channel transistor 410 on. When φ2 goes high it pumps charge on capacitor 406 through p-channel transistor 410 to supply voltage VDD_2X. The high level of φ2 also turns on n-channel transistor 400 to precharge capacitor 404 to $V_{DD}$. A current mirror formed by n-channel transistors 424 and 426 conducts current $I_B$ from the VDD_2X supply through p-channel bias transistor 420 and resistor 422. This produces bias voltage VBIAS at the common gate-drain terminal of p-channel bias transistor 420, which is applied to switches 304, 308, and 312.

Figure 5A:
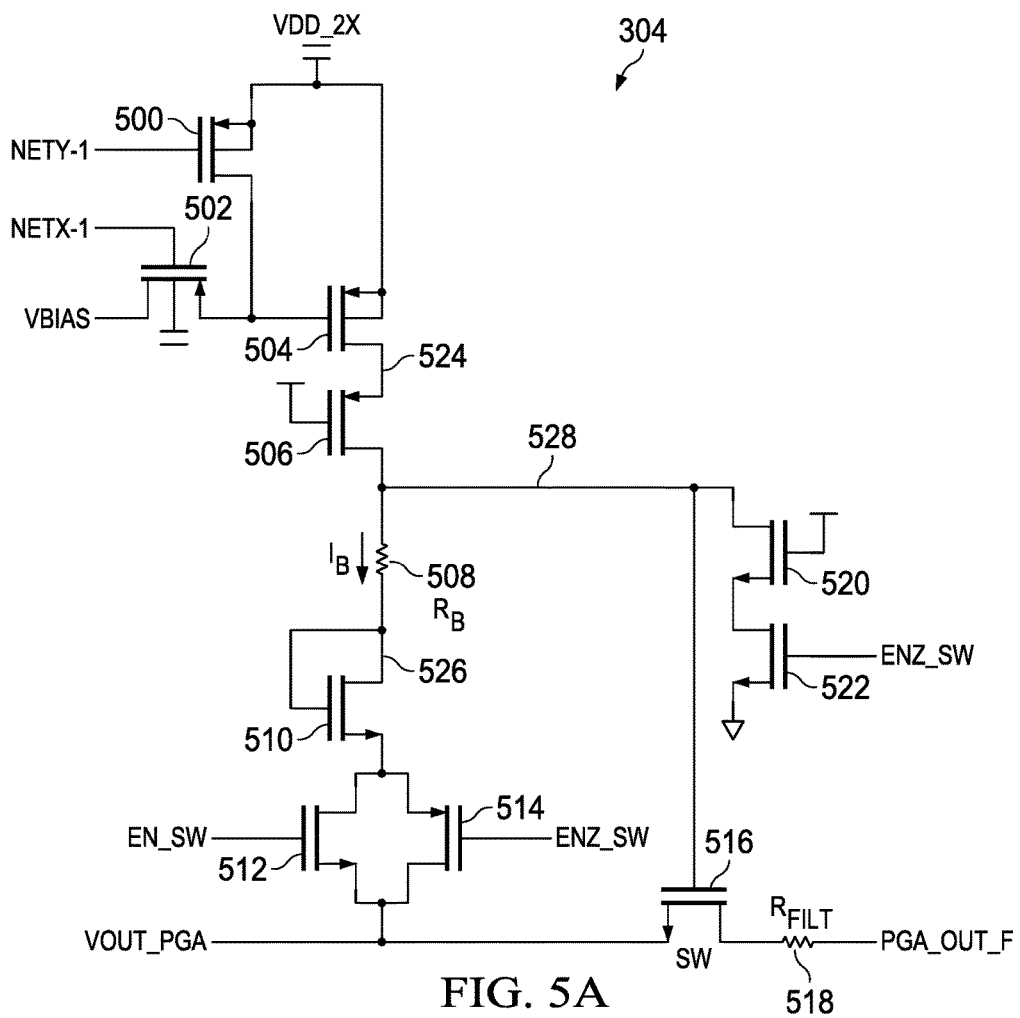
FIG. 5A is a circuit diagram of switch circuit SWITCH-1 304 of FIG. 3.

Referring now to FIG. 5A, there is a circuit diagram of SWITCH-1 304 of FIG. 3. All of the switches of FIG. 3 are substantially the same except that control signals NETX and NETY are generated by their respective boost circuits as indicated by the integer suffix Likewise, enable signal EN_SW and complementary enable signal ENZ_SW are from the SEL_FILTER bus and are unique to each switch. Therefore, only switch 304 will be described in detail. P-channel transistors 500 and 502 are coupled to receive respective signals NETY-1 and NETX-1 at their control gates. When the switch is selected NETY-1 is high at VDD_2X and NETX-1 is low at $V_{DD}$. Thus, p-channel transistor 500 is off and p-channel transistor 502 is on. P-channel transistor 502 applies bias voltage VBIAS to the gate of p-channel current mirror transistor 504, so that it conducts bias current $I_B$ as in FIG. 4A through clamp transistor 506, resistor $R_B$ 508, and threshold voltage sense transistor 510. Transistor 504 also produces a gate voltage of slightly less than VDD_2X at the gate of switch transistor 516 so that it advantageously operates in the linear region. A low level of ENZ_SW holds n-channel transistor 522 off. Voltage divider transistor 520 limits a gate-to-drain voltage of transistor 522 to $V_{DD}$-Vtn. A CMOS transmission gate formed by p-channel transistor 514 and n-channel transistor 512 is enabled by a high level of EN_SW and a low level of ENZ_SW to conduct bias current $I_B$ to the source terminal of switch transistor 516. When selected, switch transistor 516 couples input signal VOUT_PGA to output signal PGA_OUT_F via filter resistor $R_{FILT}$ 518.

Sense transistor 510 and switch transistor 516 are preferably designed to have the same size, orientation, and are in close proximity to each other. Thus, both n-channel transistors have the same threshold voltage (Vtn). Switch transistor 516 may drive a user selected capacitor 206 (FIG. 2) on the order of 1 nF. Thus, switch transistor 516 and sense transistor 510 are relatively large and may both have a width/length of 50/0.4 µm. Alternatively, switch transistor 516 may designed as five parallel 10/0.4 transistors and sense transistor 510 may be designed as a single 10/0.4 transistor. In this manner, both have the same threshold voltage and orientation and layout area is conserved. Many other equivalent combinations will be understood by one of ordinary skill in the art having access to the instant specification. The sources of both transistors 516 and 510 are coupled to each other by the CMOS transmission gate (512, 514). Transistors 512 and 514 may have a width/length of 1/0.4 and advantageously limit the capacitance of unselected switch transistors at the output the PGA 204 (FIG. 2). The gate-to-source voltage (Vgs) of switch transistor 516 is equal to the drain-to-source voltage (Vds) of diode-connected sense transistor 510 plus $I_B R_B$. Thus, any increase in Vtn of sense transistor 510 and switch transistor 516 produces the same increase in Vgs of switch transistor 516 Likewise, any decrease in Vtn of sense transistor 510 and switch transistor 516 produces the same decrease in Vgs of switch transistor 516. Any variation of the threshold voltage of switch transistor 516 with temperature is advantageously compensated by sense transistor 510. Series resistance of the current path between VOUT_PGA and PGA_OUT_F remains substantially constant with temperature. Therefore, filter bandwidth remains substantially constant as determined by selected values of $R_{FILT}$ and $C_{FILT}$.

Figure 5B:
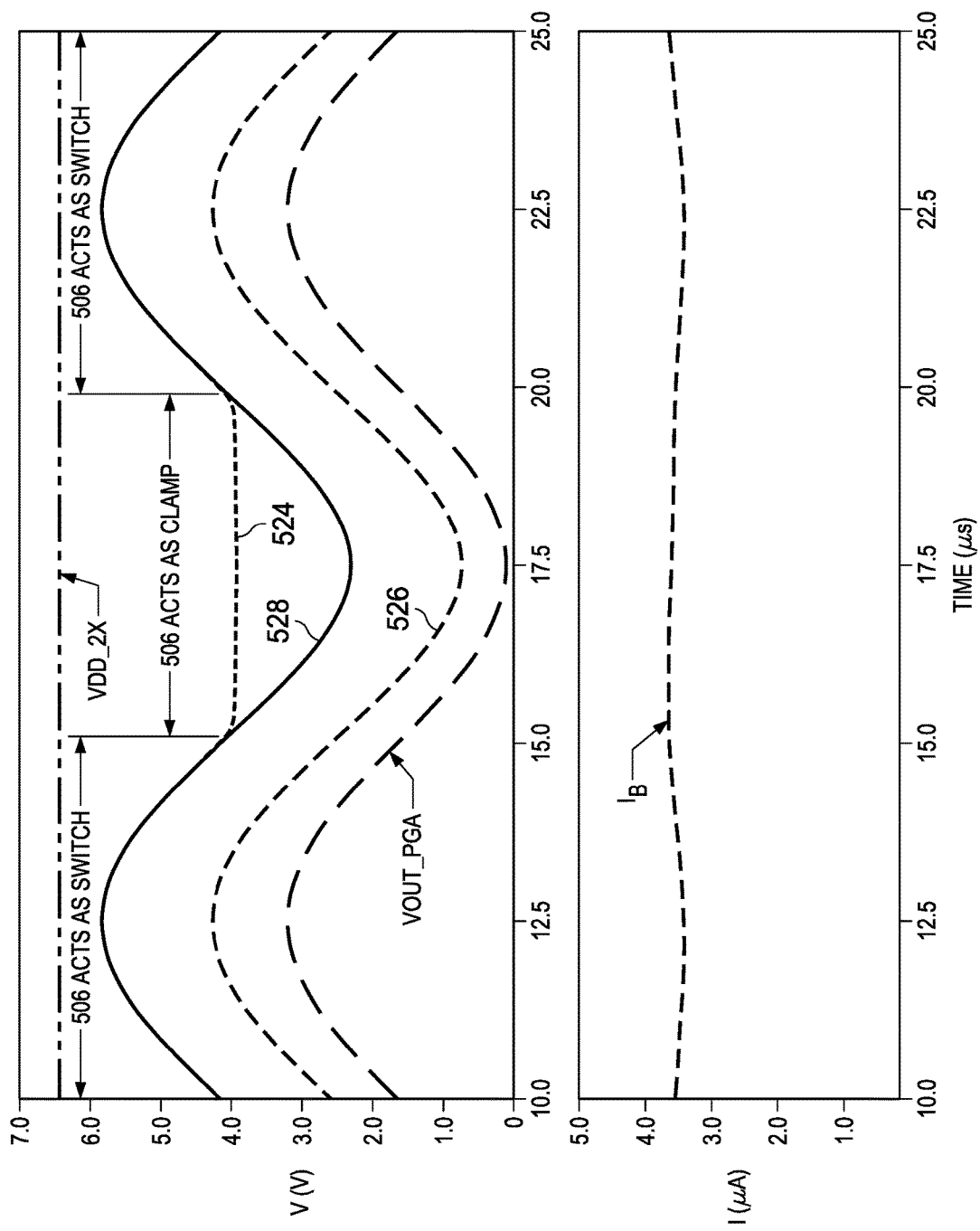
FIG. 5B is a simulated waveform diagram of the circuit of FIG. 5A.

Operation of the switch circuit of FIG. 5A will now be further explained with reference to the simulated waveforms of FIG. 5B. The output of PGA 204 is represented by a 100 kHz sine wave VOUT_PGA between $V_{DD}$ (3.3 V) and $V_{SS}$ (0 V). VDD_2X is approximately 6.5 V. The drain voltage of the threshold voltage sense transistor 510 is waveform 526. The gate of switch transistor 516 is waveform 528. The source of clamp transistor 506 is waveform 524. Current $I_B$ is shown in the lower part of FIG. 5B and is substantially constant, since current source transistor 504 always operates in saturation. During the first half cycle of VOUT_PGA, clamp transistor 506 operates in the linear region, and waveforms 524 and 528 are greater than 4.0 V. In this mode, clamp transistor 506 acts as a switch and both waveforms 524 and 528 are substantially the same.

In the second half cycle of VOUT_PGA, waveform 528 goes below 4.0 V, as VOUT_PGA goes below 1.65 V. Here, the source of clamp transistor 506 is limited to $V_{DD}$ plus a p-channel transistor threshold voltage (Vtp) and cannot go below 4.0 V as indicated by waveform 524. Thus, clamp transistor 506 operates as a clamp or voltage divider in this mode. This is highly advantageous from a reliability perspective. Whether the switch circuit is selected or unselected, none of the transistors have a voltage greater than $V_{DD}$ across their gate dielectric. This prevents harmful electric fields that might degrade gate dielectric integrity. If the switch circuit (FIG. 5A) is unselected, for example, and clamp transistor 506 is omitted so the drain of transistor 504 is directly connected to the gate of switch transistor 516, a reliability problem might occur. The gate of p-channel transistor 504 would be at VDD_2X and the drain would be held at $V_{SS}$ by n-channel transistor 522 and a high level of ENZ_SW. This would place VDD_2X across the gate and drain terminals of p-channel transistor 504 and might be detrimental to the gate dielectric.

When switch 304 is unselected NETY-1 is low at $V_{DD}$ and NETX-1 is high at VDD_2X. In this state, p-channel transistor 500 is on and p-channel transistor 502 is off. Thus, transistor 500 holds p-channel transistor 504 off (Vgs=0). P-channel transistor 506 acts as a voltage divider so that the drain of transistor 504 is approximately $V_{DD}$ plus a p-channel transistor threshold voltage (Vtp). This advantageously prevents a high gate-to-drain voltage (VDD_2X) at transistor 504 when the switch is unselected. The CMOS transmission gate (512, 514) is turned off by a low level of EN_SW and a high level of ENZ_SW. The high level of ENZ_SW also turns on n-channel transistor 522 to hold the gate of unselected switch transistor 516 at $V_{SS}$ via voltage divider transistor 520.

Referring to FIG. 6A, there is a circuit diagram of boost circuit BOOST-1 302 of FIG. 3. FIG. 6B shows the logic that generates the clock signals to operate the boost circuit. All of the boost circuits of FIG. 3 are substantially the same except for respective control signals NETX and NETY as indicated by the integer suffix. Therefore, only boost circuit 302 will be described in detail. Boost circuit 302 includes two voltage doubler circuits. The doubler circuit on the left includes cross-coupled n-channel transistors 600 and 602 and cross-coupled p-channel transistors 604 and 608. It is operated by clock signals φA and φB (FIG. 6B) when control signal ENZ_SW is high and the respective switch 304 is unselected. In the unselected mode, antiphase clock signals φA and φB are similar to respective clock signals CLK and CLKZ (FIG. 4B) and clock signals φC and φD are inactive. The doubler circuit operates as the previously described voltage doubler of FIG. 4A and produces a high level of NETX-1 of VDD_2X. The high level of NETX-1 turns on n-channel transistor 620 and drives NETY-1 low to $V_{DD}$. The low level of NETY-1 turns off n-channel transistor 618.

The doubler circuit on the right includes cross-coupled n-channel transistors 610 and 612 and cross-coupled p-channel transistors 614 and 616. It is operated by clock signals φC and φD (FIG. 6B) when switch 304 is selected. When switch 304 is selected, control signal EN_SW is high and complementary control signal ENZ_SW is low and clock signals φA and φB are disabled. In the selected mode, antiphase clock signals φC and φD are similar to respective clock signals CLK and CLKZ (FIG. 4B). The doubler circuit operates as the previously described voltage doubler of FIG. 4A and produces a high level of NETY-1 of VDD_2X. The high level of NETY-1 turns on n-channel transistor 618 and drives NETX-1 low to $V_{DD}$. The low level of NETX-1 turns off n-channel transistor 620.

When the filter circuit (FIG. 2) is powered down, the clock signals are disabled and a high level of FILT_PDN turns on n-channel transistors 624 and 628 and drive NETX-1 and NETY-1 to $V_{SS}$. The low level of NETX-1 and NETY-1 turns off n-channel transistors 618 and 620. N-channel transistors 622 and 626 act as voltage dividers to assure the gate-to-drain voltage of n-channel transistors 624 and 628 does not exceed $V_{DD}$-Vtn. It is a significant advantage of this boost circuit that none of the transistors experience a maximum gate dielectric voltage greater than $V_{DD}$ in normal operation. Therefore, reliability is maintained with little or no gate dielectric stress.

Figure 7:
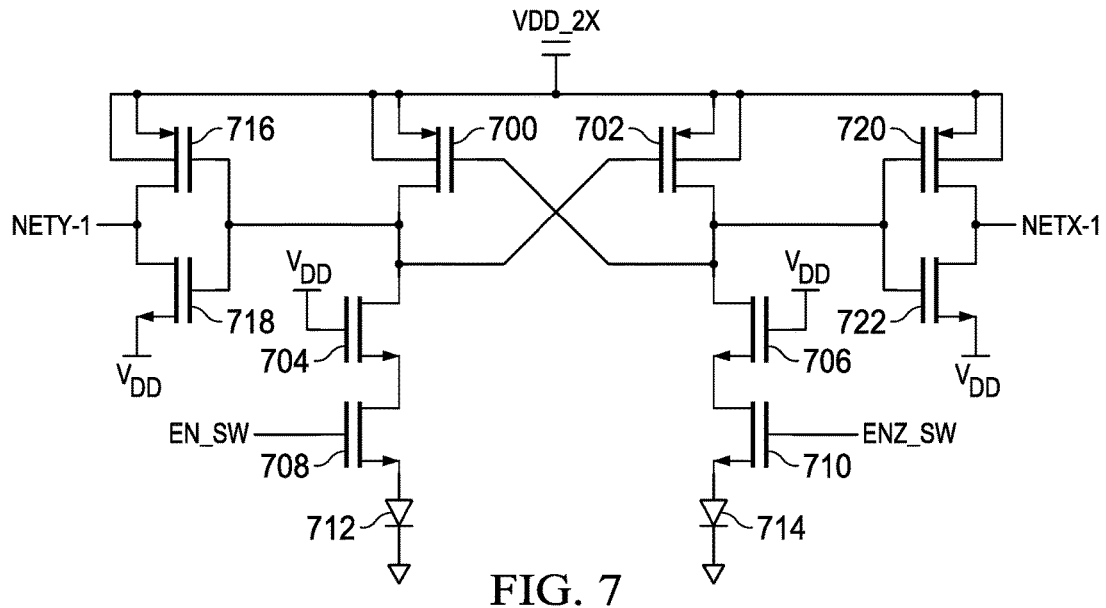
FIG. 7 is a circuit diagram of a level translator circuit that may be used as an alternative to the boost circuit of FIG. 6A.

Turning now to FIG. 7, there is a circuit diagram of a level translator circuit that may be used as an alternative to the boost circuit of FIG. 6A but may have reliability issues for some applications. The circuit receives enable signal EN_SW and complementary enable signal ENZ_SW, having a voltage range from $V_{DD}$ to $V_{SS}$, and produces complementary signals NETX-1 and NETY-1, having a voltage range from VDD_2X to $V_{DD}$. Voltage supply VDD_2X is connected to the common source terminals of cross-coupled p-channel transistors 700 and 702. Drain terminals of transistors 700 and 702 are coupled to drain terminals of n-channel input transistors 708 and 710 through respective n-channel voltage divider transistors 704 and 706. Sources of n-channel input transistors 708 and 710 are coupled to reference voltage supply $V_{SS}$ via respective diodes 712 and 714. These diodes may be diode-connected n-channel, p-channel transistors, diode connected bipolar transistors, or pn junction diodes. Moreover, each diode may include two or more series-connected diodes.

In operation, a high level of EN_SW at the gate of n-channel transistor 708 pulls the gate of p-channel transistor 702 to $V_{SS}$ plus a voltage Vd across diode 712. Input transistor 710 is off in response to a low level of complementary enable signal ENZ_SW. Thus, p-channel transistor 702 drives the gate of p-channel transistor 700 high, thereby turning it off. The drain terminals of p-channel transistors 700 and 702, therefore, are at $V_{SS}$+Vd and VDD_2X, respectively. An inverter formed by p-channel transistor 716 and n-channel transistor 718 receives the $V_{SS}$+Vd level at the drain of p-channel transistor 700 and produces a high level (VDD_2X) of NETY-1. Another inverter formed by p-channel transistor 720 and n-channel transistor 722 receives the VDD_2X level at the drain of p-channel transistor 702 and produces a low level ($V_{DD}$) of NETX-1 Likewise, a low level of EN_SW and a high level of ENZ_SW produce respective low ($V_{DD}$) and high (VDD_2X) levels of NETY-1 and NETX-1.

This has an advantage of simplicity and static operation. However, it also requires voltage divider transistors 704 and 706 to limit the drain-to-gate voltage of respective n-channel transistors 708 and 710 to $V_{DD}$-Vtn. It also requires diodes 712 and 714 to limit the Vgs of respective p-channel transistors 702 and 700 to VDD_2X-Vd. For example, if $V_{DD}$ is 3.3 V and Vd is 0.7 V, then VDD_2X−Vd=6.6−0.7=5.9 V, which may adversely affect reliability of p-channel transistors 700 and 702. If each of diodes 712 and 714 is two series-connected diodes, then VDD_2X−Vd=6.6−1.4=5.2 V. Even two series-connected diodes, therefore, produce a peak voltage that is 1.9 V greater than $V_{DD}$ and may induce gate dielectric wear out over time. Moreover, although each of diodes 712 and 714 may include two or more series-connected diodes, a high level input signal must still develop a sufficient Vgs at each n-channel transistor to overcome a corresponding p-channel transistor. For example, a high level of EN_SW (3.3 V) and a diode voltage of 0.7 V will develop a Vgs of 2.6 V at n-channel transistor 708. This must be sufficient to overcome the drain current of p-channel transistor 700 and pull the gate of p-channel transistor 702 low. For a diode voltage of 1.4 V, the Vgs of n-channel transistor 708 is only 1.9 V. Thus, a proper ratio of n-channel input transistors to p-channel cross-coupled transistors is required. However, using many such diodes to solve reliability may not work since the n-channel transistors 704 and 708 will offer more resistance due to reduced Vgs as well as an increased body effect with a current maximum gate voltage of $V_{DD}$. This might work for a very limited supply range and Vt or if gate dielectric permits a much larger Vgs. Hence this is not a practical solution for most real design applications and cannot be generalized across node technologies.

Figure 8A:
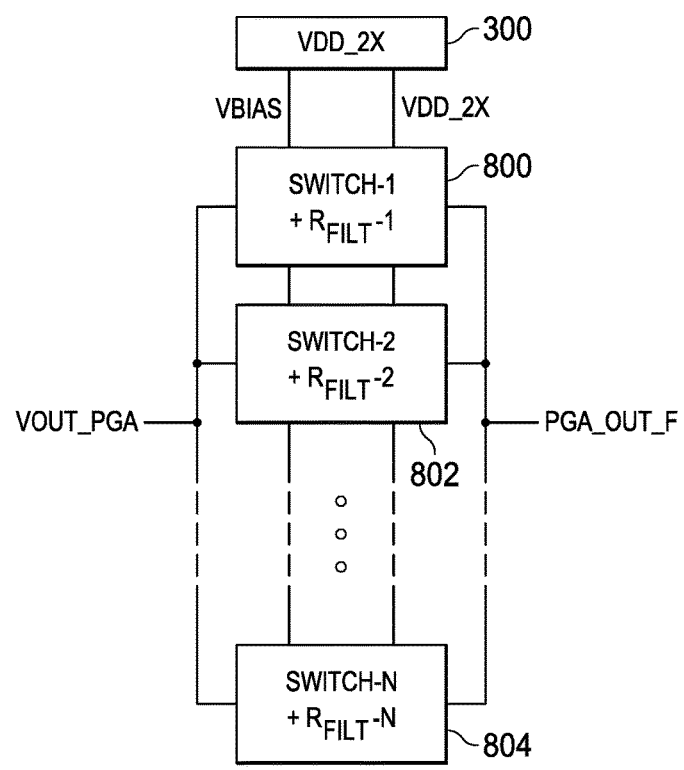
FIG. 8A is a block diagram of another embodiment of the programmable resistor array circuit of FIG. 2.

Referring now to FIG. 8A, there is a block diagram of another embodiment of the programmable resistor array circuit of FIG. 2. The circuit includes N switch elements (800-804), where N is a positive integer. Each switch element is coupled to receive PGA output signal VOUT_PGA. Each switch is coupled to a common output terminal that produces output signal PGA_OUT_F. Voltage doubler circuit 300 is the same as previously discussed with regard to FIGS. 4A and 4B and produces bias signal VBIAS and VDD_2X, which are applied to each switch.

Figure 8B:
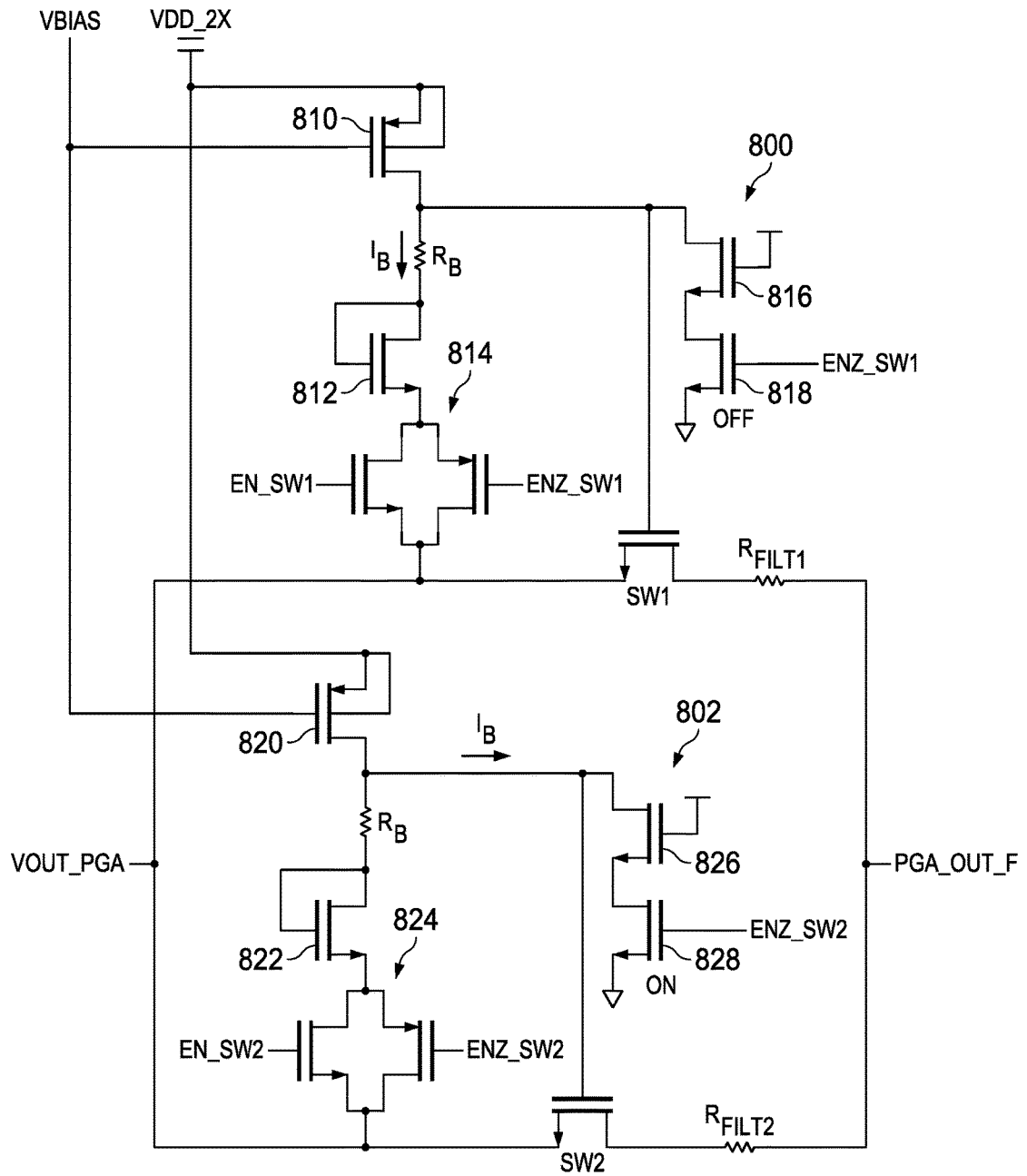
FIG. 8B is a circuit diagram of switch elements SWITCH-1 800 and SWITCH-2 802 of FIG. 8A.

Referring next to FIG. 8B, there is a circuit diagram of another embodiment of the present invention including SWITCH-1 800 and SWITCH-2 802 of FIG. 8A. All of the N switches of FIG. 8A are substantially the same and are differentiated by their respective integer suffix Likewise, enable signal EN_SW complementary enable signal ENZ_SW are from the SEL_FILTER bus and are unique to each switch. When SWITCH-1 800 is selected enable signal EN_SW1 is high and complementary enable signal ENZ_SW1 is low. If SWITCH-2 802 is unselected, enable signal EN_SW2 is low and complementary enable signal ENZ_SW2 is low. Bias voltage VBIAS is applied to the gates of p-channel current mirror transistors 810 and 820. Both P-channel transistors 810 and 820 conduct bias current $I_B$. CMOS transmission gate 814 is on, so current $I_B$ is conducted through resistor $R_B$ and threshold voltage sense transistor 812. The low level of ENZ_SW1 assures no current is conducted through n-channel transistors 816 and 818. Thus, SWITCH-1 800 operates as previously described with regard to FIG. 5A to compensate for any threshold voltage variation of switch transistor SW1. CMOS transmission gate 824, however, is off, so no current is conducted through resistor $R_B$ or threshold voltage sense transistor 822. The high level of ENZ_SW2 conducts current $I_B$ to $V_{SS}$ through n-channel transistors 826 and 828.

This embodiment of the present invention is less complex than the embodiment of FIG. 3. Individual boost circuits for each switch are advantageously eliminated. As with the embodiment of FIG. 3, any number of the N switches may be selectively enabled and no voltage greater than $V_{DD}$ appears across any gate dielectric whether a switch is selected or unselected. Moreover, filter resistors such as $R_{FILT1}$ and $R_{FILT2}$ may be the same size or different sizes, such as binary weighted resistors or any other desirable values. One disadvantage of this embodiment, however, is that each unselected switch circuit continues to conduct current $I_B$ to reference voltage terminal $V_{SS}$. Another disadvantage of this embodiment is that additional programmability may require a design change to voltage doubler circuit 300 to accommodate a larger load current. The embodiment of FIG. 3 allows adding more filter resistance programmability options without affecting the design of voltage doubler 300.

Figure 9:
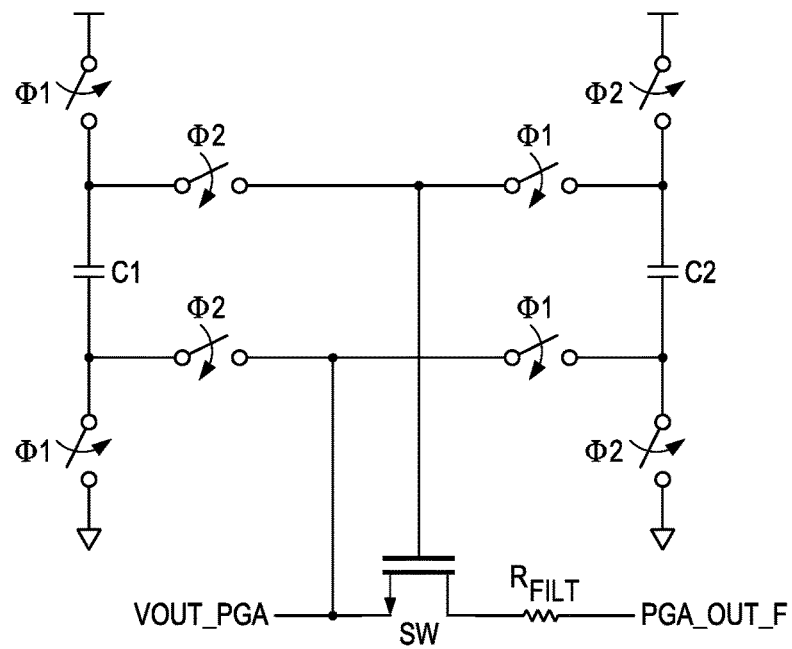
FIG. 9 is a simplified circuit diagram of a gate boosted switch for continuous time operation according to another embodiment of the present invention.

FIG. 9 is a simplified circuit diagram of a gate boosted switch for continuous time operation according to another embodiment of the present invention. Switched capacitor circuits have been used in sample and hold analog applications of the prior art. However, these circuits are unsuitable for continuous time applications such as the continuous time PGA filter. The embodiment of FIG. 9 is adapted to operate in a continuous time environment. Clock signals φ1 and φ2 are antiphase clock signals as previously described at FIG. 4B. Switches may be CMOS or bipolar transistors as is well known in the art. Switch transistor SW and resistor $R_{FILT}$ are as previously described with regard to switch 210 and resistor 212 (FIG. 2) and elsewhere in the instant application. In operation, clock signal φ1 initially closes all φ1 switches and all φ2 switches are initially open. In this state, capacitor C1 is charged to $V_{DD}$ and a charge on capacitor C2 is connected across the gate and source terminals of switch transistor SW to boost Vgs. Next, clock signal φ2 closes all φ2 switches and all φ1 switches are opened. In this state, capacitor C2 is charged to $V_{DD}$ and a charge on capacitor C1 is connected across the gate and source terminals of switch transistor SW to boost Vgs to VOUT_PGA plus $V_{DD}$. The switching sequence continues in this complementary manner so that switch transistor SW operates in the linear region with Vgs approximately equal to $V_{DD}$. Although less complex than other embodiments of the present invention, the switched capacitor arrangement inherently generates switching noise at the gate of switch transistor SW. This switching noise creates ripples in filter output signal PGA_OUT_F, and may be unsuitable for some applications.

Figure 10:
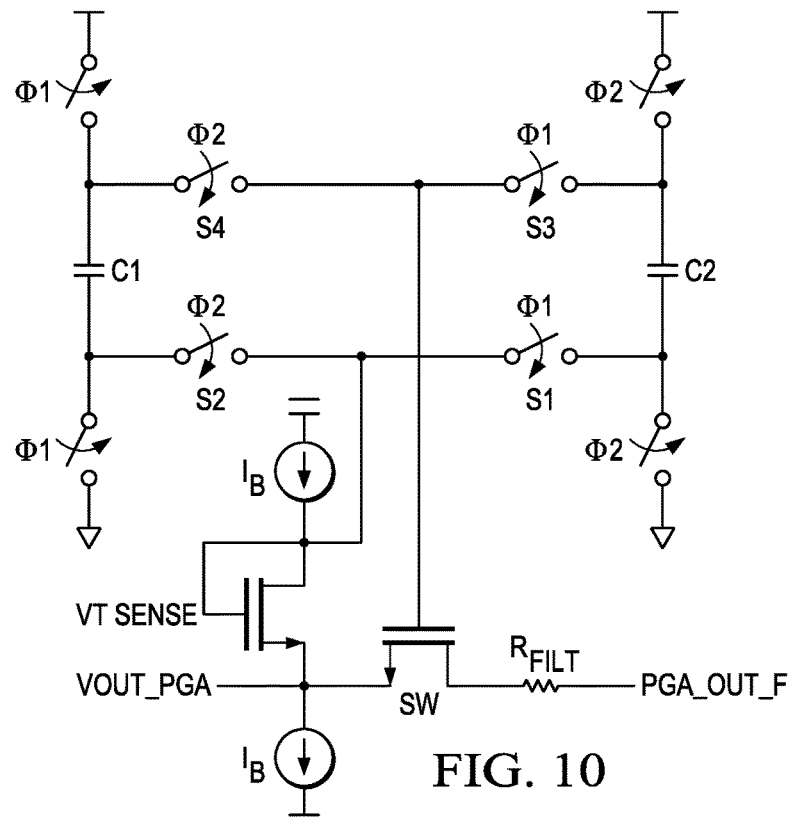
FIG. 10 is a simplified circuit diagram of another gate boosted switch for continuous time operation according to yet another embodiment of the present invention.

FIG. 10 is a simplified circuit diagram of another gate boosted switch for continuous time operation according to yet another embodiment of the present invention. The embodiment of FIG. 10 is similar to the embodiment of FIG. 9 except that diode-connected Vt sense transistor VT SENSE and current sources $I_B$ are added. Advantages of this embodiment include simplicity as well as threshold voltage compensation for switch transistor SW. However, there are also several disadvantages. The switched capacitor arrangement inherently generates switching noise at the gate of switch transistor SW. This switching noise creates ripples in filter output signal PGA_OUT_F, and may be unsuitable for some applications. Additionally, switches S1 and S2 must pass the voltage on respective capacitors C2 and C1 as well as the threshold voltage of VT SENSE. Thus, S1 and S2 require a boosted gate voltage.

Still further, while numerous examples have thus been provided, one skilled in the art should recognize that various modifications, substitutions, or alterations may be made to the described embodiments while still falling within the inventive scope as defined by the following claims. For example, many of the circuits in the foregoing embodiments may be realized with bipolar or BiCMOS technology. Further, even though the current innovation is implemented with a programmable gain amplifier, it may be extended to any continuous time application that needs linear programmable switches with low output ripple. Other combinations will be readily apparent to one of ordinary skill in the art having access to the instant specification.

The invention claimed is:

1. A circuit, comprising:
   an output circuit coupled between a first voltage terminal and a common terminal and having a first output terminal;
   a current source transistor having a current path coupled between a second voltage terminal and a second output terminal;
   a threshold voltage sense transistor having a current path coupled between the first and second output terminals and having a connected gate and drain terminal; and
   an output transistor having a current path coupled between the first output terminal and a third output terminal and having a control gate coupled to the second output terminal.

2. The circuit of claim 1, comprising a clamp transistor having a control terminal connected to the first voltage terminal and having a current path coupled between the second output terminal and the current source transistor.

3. The circuit of claim 1, comprising a select transistor having a current path coupled between the first output terminal and the threshold voltage sense transistor.

4. The circuit of claim 1, wherein the threshold voltage sense transistor and the output transistor have a same width and channel length.

5. The circuit of claim 1, wherein the output circuit comprises an amplifier.

6. The circuit of claim 1, wherein the second voltage terminal is an output terminal of a charge pump.

7. The circuit of claim 1, comprising a current mirror circuit having an output terminal coupled to a control terminal of the current source transistor.

8. The circuit of claim 1, wherein the second voltage terminal is arranged to supply a voltage having a value substantially twice a value of a voltage at the first voltage terminal.

9. The circuit of claim 1, wherein a maximum voltage across a gate dielectric of each transistor is equal to or less than a voltage provided at the first voltage terminal.

10. A programmable filter circuit, comprising:
    an amplifier coupled between a first voltage terminal and a common terminal and having a first output terminal;
    a plurality of switch circuits having a respective input terminal coupled to the first output terminal and having a respective resistor coupled to a third output terminal, each switch circuit comprising:
    a current source transistor having a current path coupled between a second voltage terminal and a second output terminal;
    a threshold voltage sense transistor having a current path coupled between the first and second output terminals and having a connected gate and a drain terminal; and
    an output transistor having a current path coupled between the first output terminal and the respective resistor and having a control gate coupled to the second output terminal.

11. The circuit of claim 10, wherein said each switch circuit comprises a clamp transistor having a control terminal connected to the first voltage terminal and having a current path coupled between the second output terminal and the current source transistor.

12. The circuit of claim 10, wherein said each switch circuit comprises a select transistor having a current path coupled between the first output terminal and the threshold voltage sense transistor.

13. The circuit of claim 10, wherein the threshold voltage sense transistor and the output transistor of each said switch circuit have a same channel width, channel length, and threshold voltage.

14. The circuit of claim 10, wherein the second voltage terminal is an output terminal of a charge pump.

15. The circuit of claim 10, comprising a current mirror circuit having an output terminal coupled to a control terminal of the current source transistor of said each switch circuit.

16. The circuit of claim 10, wherein the second voltage terminal is arranged to supply a voltage having a value substantially twice a value of a voltage at the first voltage terminal.

17. The circuit of claim 10, wherein a maximum voltage across a gate dielectric of each transistor is equal to or less than a voltage provided at the first voltage terminal.

* * * * *